United States Patent
Ducros et al.

(10) Patent No.: US 9,952,360 B2
(45) Date of Patent: Apr. 24, 2018

(54) METHOD FOR PRODUCING A TEXTURED REFLECTOR FOR A THIN-FILM PHOTOVOLTAIC CELL, AND RESULTING TEXTURED REFLECTOR

(71) Applicant: COMMISSARIAT À L'ENERGIE ATOMIQUE ET AUX ENERGIES ALTERNATIVES, Paris (FR)

(72) Inventors: Cédric Ducros, Bevenais (FR); Helga Szambolics, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/396,906

(22) PCT Filed: Apr. 9, 2013

(86) PCT No.: PCT/FR2013/000093
§ 371 (c)(1),
(2) Date: Oct. 24, 2014

(87) PCT Pub. No.: WO2013/160570
PCT Pub. Date: Oct. 31, 2013

(65) Prior Publication Data
US 2015/0109694 A1   Apr. 23, 2015

(30) Foreign Application Priority Data

Apr. 27, 2012 (FR) ..................... 12 01248

(51) Int. Cl.
*G02B 5/10* (2006.01)
*G02B 5/08* (2006.01)
(Continued)

(52) U.S. Cl.
CPC ............ *G02B 5/09* (2013.01); *G02B 5/0875* (2013.01); *H01L 31/02366* (2013.01);
(Continued)

(58) Field of Classification Search
CPC ...... G02B 7/183; G02B 19/0042; G02B 5/10; G02B 5/0808; G02B 7/182; G02B 5/08;
(Continued)

(56) References Cited

U.S. PATENT DOCUMENTS 7,351,607 B2 * 4/2008 Wang ..................... B82Y 10/00
257/40
8,158,501 B2 * 4/2012 Kim .................... H01L 21/0237
257/E21.09

(Continued)

FOREIGN PATENT DOCUMENTS

EP  0 698 929 A2  2/1996
EP  1 921 668 A2  5/2008
(Continued)

OTHER PUBLICATIONS

Lewis, Brian Wellington. "Silica Nanosphere Textured Back Reflectors for Increased Absorption in Thin Film Amorphous Silicon Solar Cells". pp. 1-55, May 4, 2010.
(Continued)

*Primary Examiner* — Jade R Chwasz
(74) *Attorney, Agent, or Firm* — Oliff PLC

(57) ABSTRACT

A textured reflector for a solar cell of thin film type is produced by deposition of a metal film on a support through openings of a mask. The mask is formed by a thin film formed by coplanar and preferably joined balls, the gaps between the balls forming the openings of the mask. The thin film is further advantageously formed by balls made from silica or from polymer material.

20 Claims, 4 Drawing Sheets

(51) Int. Cl.
*G02B 7/182* (2006.01)
*G02B 5/09* (2006.01)
*H01L 31/0236* (2006.01)
*H01L 31/0224* (2006.01)
*H01L 31/056* (2014.01)
*H01L 31/054* (2014.01)

(52) U.S. Cl.
CPC .... *H01L 31/022466* (2013.01); *H01L 31/056* (2014.12); *H01L 31/0547* (2014.12); *Y02E 10/52* (2013.01)

(58) Field of Classification Search
CPC ..... G02B 5/0875; G02B 5/09; H01L 31/0547; H01L 31/02167; H01L 31/022466; H01L 31/02366; H01L 31/042; H01L 31/0543; H01L 31/056; Y02E 10/52
USPC ........ 359/853, 850, 868, 869, 871, 883, 884
See application file for complete search history.

(56) References Cited

U.S. PATENT DOCUMENTS

2011/0005575 A1    1/2011  Cao
2011/0092055 A1*   4/2011  Kim ................... H01L 21/0237
                                                           438/478

FOREIGN PATENT DOCUMENTS

KR    2009-0087529 A    8/2009
WO    2008/035818 A1    3/2008

OTHER PUBLICATIONS

Kosiorek et al. "Fabrication of Nanoscale Rings, Dots, and Rods by Combining Shadow Nanosphere Lithography and Annealed Polystyrene Nanosphere Masks". Small-Journal, vol. 1, No. 4, pp. 439-444, Feb. 25, 2005.

Dec. 7, 2013 International Search Report issued in Application No. PCT/FR2013/000093.

Zhu et al. "Nanodome Solar Cells with Efficient Light Management and Self-Cleaning". Nano Letters, vol. 10, pp. 1979-1984, 2010.

Sai et al. "Effect of Self-Orderly Textured Back Reflectors on Light Trapping in Thin-Film Microcrystalline Silicon Solar Cells". Journal of Applied Physics, vol. 105, pp. 094511-1 to 094511-8, May 14, 2009.

Sep. 5, 2016 Office Action issued in Chinese Patent Application No. 201380027209.0.

Dec. 22, 2015 Office Action issued in Chinese Patent Application No. 201380027209.0.

* cited by examiner

METHOD FOR PRODUCING A TEXTURED REFLECTOR FOR A THIN-FILM PHOTOVOLTAIC CELL, AND RESULTING TEXTURED REFLECTOR

BACKGROUND OF THE INVENTION

The invention relates to a method for producing a textured reflector for a thin film photovoltaic cell and also relates to a textured reflector obtained in this way.

STATE OF THE ART

A thin film solar cell or thin film photovoltaic cell conventionally comprises at least one substrate (or support) on which at least one thin film of photovoltaic material, also called active layer or absorbent layer, is deposited. It also conventionally comprises an electrode and electric contacts.

Different categories of thin film photovoltaic cells exist depending on the type of photovoltaic material used. The latter can for example be amorphous silicon (a-Si) or it can be formed by a hydrogenated amorphous silicon a-Si:H/ monocrystalline silicon μc-Si:H bilayer, etc.

One of the major issues in the field of thin layer photovoltaic cells at the present time is to increase the photovoltaic conversion efficiency by increasing the efficiency of the optic trapping of the incident electromagnetic radiation within the solar cell, by means of a textured reflector arranged between the substrate and the active layer.

For example, US Patent application 2011/0005575 describes the use of a reflector presenting a texture in the form of a wave in a solar cell to in particular enhance the optic trapping of the light, the reflectivity and the conversion efficiency. The thin films deposited on the reflector are then also textured.

The shape and amplitude of the texture of the reflector in particular determine the wavelength range in which optic trapping is efficient. The characteristics of the texture of the reflector thus enable the optic response of the solar cell to be modified in substantial manner. It is therefore necessary to elaborate methods that are dependable, rugged, reproducible and easy to implement in order to obtain a textured reflector presenting optimal optic performances.

The article by Zhu et al, "Nanodome Solar Cells with Efficient Light Management and Self-Cleaning" (Nanoletters 2010, 10, 1974.1984) proposes texturing the substrate, made from glass or quartz, to form a solar cell presenting a texture in the form of nanodomes (nanodome solar cells). To achieve this texture, silica balls are in a first step deposited on the substrate. The substrate is then etched, through the ball bed, by reactive ion etching under a $O_2/CHF_3$ mixture. Finally a multilayer structure is deposited on the textured substrate.

However, this technique does present several drawbacks: contaminations can arise from the species of the plasma, the etching rate is relatively slow, the production method is fairly heavy to set up as far as time and cost are concerned, and above all this method can only be applied on substrates that are able to be easily etched, such those made from glass and quartz.

Another production method that is able to be set up to achieve a textured surface is described in the article by Hitoshi Sai (Journal of Applied Physics 2009, 105, 094511). In particular, anodization of an aluminium substrate is performed under a high voltage. The voltage applied causes formation of a porous oxide layer of $Al_3O_3$ at the surface of the substrate. At the same time, the surface of the aluminium substrate is modified and takes a texture in the form of waves. After anodization, the oxide layer is removed and a textured aluminium substrate is thus obtained.

Such a technique does however require high anodization voltages and it is difficult to control the texture and periodicity of the patterns obtained. Furthermore, the choice of the substrate is particularly reduced.

OBJECT OF THE INVENTION

The object of the invention is to remedy the drawbacks of the prior art, and in particular to propose a method for producing a textured reflector for a thin film solar cell that is simple and easy to implement, robust, reproducible and inexpensive.

This object tends to be achieved by the appended claims.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
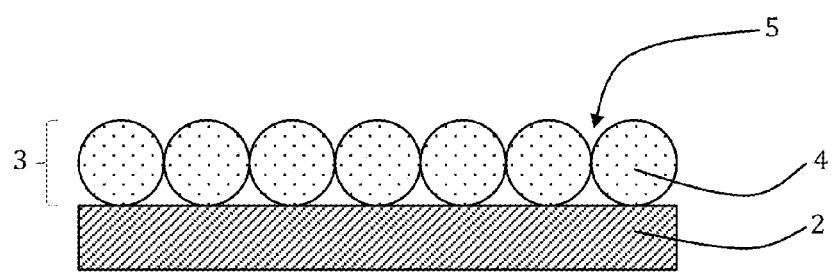
FIGS. 1 to 4 illustrate different steps of producing a textured reflector for a thin film solar cell, in schematic manner in cross-section.

As illustrated in FIGS. 1 to 4, a method for producing a textured reflector for a solar cell, and more particularly for a thin film solar cell, comprises at least deposition of a metal film 1 on a support 2, which is preferably flat or non-textured, through openings of a specific mask 3. Support 2 is preferably made from metal.

Mask 3 used to perform deposition of metal film 1 is in fact formed by a first layer also called thin film constituted by coplanar balls 4.

What is meant by thin film is advantageously a layer having a thickness comprised between 300 nm and 1500 nm. The thickness is smaller than the radius of the sphere.

Advantageously, mask 3 is formed by said thin film. Preferably, balls 4 form a single thin film. They are arranged in such a way as to form a bed of balls on the support, each ball 4 being in direct contact with said support 2. In this case, they are therefore not stacked on one another.

Furthermore, balls 4 forming the thin layer are preferably joined. The thin film formed in this way is then homogenous and regular, with gaps 5 between balls 4 forming the openings of mask 3, through which the metal designed to form metal film 1 is deposited.

Balls 4 preferably being of spherical shape, gaps 5 between the balls are then all identical.

Balls 4 are advantageously made from silica, metal, ceramic or polymer, which in particular enables a mask to be produced at low cost. For example, they can be made from polystyrene or from aluminium, titanium, chromium or gold.

Preferably, the mean diameter of balls 4 is comprised between 100 nm and 5000 nm, and advantageously between 500 nm and 2500 nm.

Balls 4 forming the thin layer are furthermore advantageously mono-dispersed, i.e. morphologically identical balls, with a very narrow size distribution, centred around a particular mean diameter with a standard deviation of more or less 10%.

Thus, for a given mask 3, balls 4 all advantageously have the same mean diameter.

Finally, the thin layer forming mask 3 advantageously presents a compactness comprised between 80% and 94%. The compactness, also called filling factor, is the ratio of the total volume of balls 4 constituting the thin layer over that of the total volume of the thin layer which contains them. Such a value range for the compactness represents a good trade-off with respect to the size of the gaps used for deposition of the metal film.

As illustrated in FIG. 1, mask 3 is for example made on the support by spin-coating, or by the Langmuir-Blodgett method.

Such ball deposition techniques are very competitive in terms of cost and applicable to large surfaces. They furthermore enable compatibility to be achieved with a large choice of supports such as for example a support made from metal, silicon, glass or polymer.

According to a particular embodiment, formation of mask 3 can comprise an etching step of balls 4 previously formed on support 2 in order to reduce their initial mean diameter. The etching step enables the initial size of balls 4 to be reduced thereby increasing the volume of gaps 5.

The etching step can be performed by chemical etching or dry etching (reactive ion etching).

Figure 2:
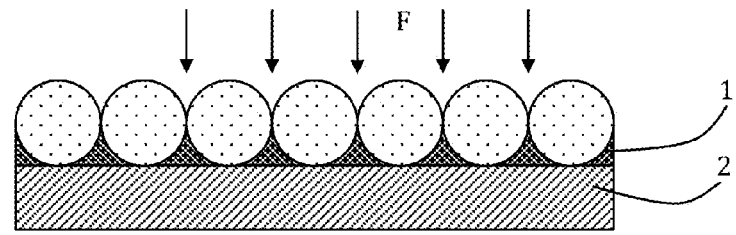

Metal film 1 is then deposited through the openings of mask 3, between the gaps 5 of balls 4, as illustrated in FIG. 2. Such a deposition step is schematized in FIG. 2 by arrows F located above mask 3. Metal film 1 deposited in this way is composed of a plurality of dots 6, each dot occupying the gap or free space between the joined balls and advantageously between three joined balls, which enables the texture of metal film 1 to be obtained. For example, for a mask 3 comprising balls 4 with a mean diameter comprised in the 300 nm to 1500 nm range, dots 6 with a height comprised between 150 and 750 nm are obtained.

Figure 3:
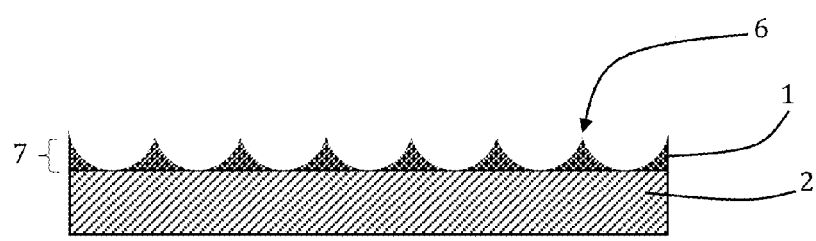

The dots can be separated from one another, as represented in FIG. 3. The dots can comprise at least three or four faces depending on the arrangement of the balls. Each face presents a complementary shape of the balls, i.e. the shape of an arc of a circle. The dots can also be joined to one another at the level of the support so as to form a honeycomb structure.

Advantageously, deposition of metal film 1 is performed by magnetron cathode sputtering or by vacuum evaporation.

These technologies do not damage balls 4 and enable a uniform layer to be deposited through mask 3, at the level of gaps 5 between balls 4.

Furthermore, formation of mask 3 being well controlled, the spacing and period of metal dots 6 are perfectly controlled, in precise and reproducible manner. Furthermore, by varying the size of balls 4 and the compactness of mask 3, the characteristics of metal film 1 are easily modifiable.

When balls 4 are monodispersed, the spacing between dots 6 is constant. In this case, the maximum distance separating dots 6 will be a distance equivalent to that of the mean diameter of balls 4, i.e. between 300 nm and 1500 nm for balls with a diameter of 300 to 1500 nm, which corresponds to the targeted wavelength range in the photovoltaic field. The texture of metal film 1 and the periodicity of spacing of dots 6 are therefore controlled and the efficiency of the optic trapping of the incident electromagnetic radiation is thus enhanced.

Preferably, metal film 1, deposited through mask 3, is a film formed by a metal chosen from aluminium, chromium, silver and copper. It can also be formed by an alloy of one or more of the above-mentioned metals.

The maximum thickness 7 of metal film 1 is advantageously comprised between 150 nm and 750 nm and corresponds to the maximum height of dots 6 formed in gaps 5 of balls 4. The height of dots 6 is therefore controlled both by the quantity of metal deposited when formation of metal film 1 takes place and by the size of balls 4. A more or less pronounced form factor of the dots, corresponding to the dot height over the dimension of the base of the dot, can thus be obtained.

The form factor of dots 6 can therefore also be modified by etching balls 4 before metal film 1 is deposited.

The geometric aspect of the texture is thus easily controlled.

After the deposition step of metal film 1 on support 2, mask 3 is removed as illustrated in FIG. 3. One of the techniques used for removing the mask is for example immersion in an ultrasonic ethanol bath for 5 minutes.

Furthermore, in order not to damage dots 6 when removing mask 3, metal dots 6 forming metal film 1 preferably have a maximum height that is smaller than the radius of balls 4.

In certain cases, metal film 1 textured in this way constitutes the reflector. The textured reflector is in particular formed by metal dots 6. The latter can advantageously be formed by a silver base to obtain a reflector having good optic and electric properties.

Figure 4:
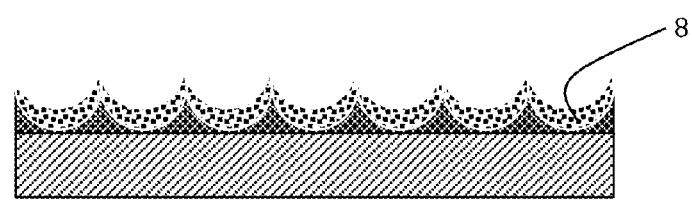

In other cases, metal film 1 can be associated with at least one other metal film as illustrated in FIG. 4.

Thus, after mask 3 has been removed, a uniform deposition of an additional metal film 8 can be performed on metal film 1. Additional film 8 is deposited for example by physical vapor deposition or chemical vapor deposition. These technologies enable a uniform film to be deposited.

What is meant by uniform deposition is that the thickness of the deposited additional film 8 is substantially the same at any point of the surface. In this way, as it is deposited on textured metal film 1, it also presents a textured surface. Additional film 8 has a thickness preferably comprised between 50 nm and 1500 nm and more particularly between 100 nm and 500 nm.

Additional film 8 is formed by a metal film chosen from silver, aluminium, copper, chromium and titanium or one of their alloys, i.e. an alloy of one or more of the above-mentioned metals. More particularly, silver can be chosen for its good optic properties, as it is an excellent reflector, and for its electric properties, in particular in terms of conductivity. A good conductivity for example enables the charges generated by the solar cell to be removed.

Additional film 8 is advantageously formed by a different metallic material from that constituting metal film 1.

Any other metal described above can be used to constitute metal film 1. This metal can be inexpensive and present low optic properties. As dots 6 are covered by additional film 8, only the latter film can in fact present good optic properties for the targeted applications. This combination of two metal films 1 and 8 in particular enables production costs to be reduced.

According to a preferred embodiment, metal film 1 is made from aluminium and additional film 8 is made from silver. These two superposed films then form a textured reflector suitable for producing a thin film solar cell.

Advantageously, one or more layers could be interposed between support 2 and the textured reflector, for example to improve the flatness of support 2.

Figure 5:
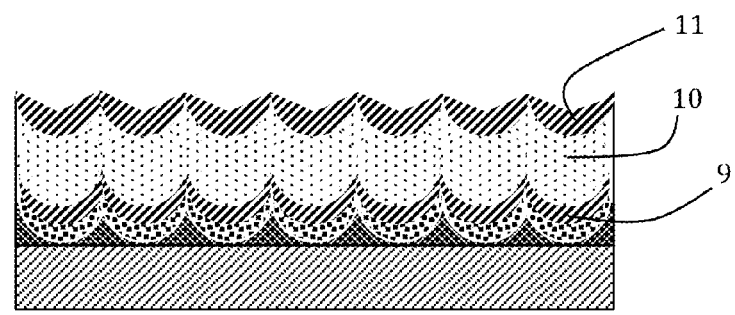
FIG. 5 illustrates a thin film solar cell comprising the textured reflector according to FIG. 4, in schematic manner in cross-section.

According to the embodiments described in the foregoing, the method for producing the textured reflector formed in this way can be completed by other operations to form a thin film solar cell. The last components can therefore be deposited once the textured reflector has been produced to form the solar cell. An example of a solar cell is thus represented in FIG. 5. The cell comprises:
- a support 2, for example made from metal, silicon, glass or polymer,
- a textured reflector as represented in FIG. 4,
- a first layer 9, made from transparent conducting oxide (TCO),
- an absorbent layer 10,
- a second transparent conducting oxide layer 11,
- and electric contacts.

The transparent conducting oxide is for example chosen from ITO, SnO2:F, ZnO:Al, ZnO:B, ZnO:Ga, IZO, IOH.

A comparative test was performed to determine the optimum diameter of balls 4 of mask 3 used for producing a particular textured reflector. In this example, the object is to obtain a maximum absorption for a thin film solar cell the absorbent layer of which has a gap of about 1.4 eV. Absorbent layer 10 used for producing the solar cell is made from aSiGe:H and transparent conductive oxide layers 9 and 11 are made from AZO (ZnO:Al).

Support 2 is made from glass and balls 4 forming the mask are made from silica.

Four masks 3 were produced with silica balls 4 having a mean diameter respectively of 500 nm, 1000 nm, 1500 nm and 2000 nm.

Figure 6:
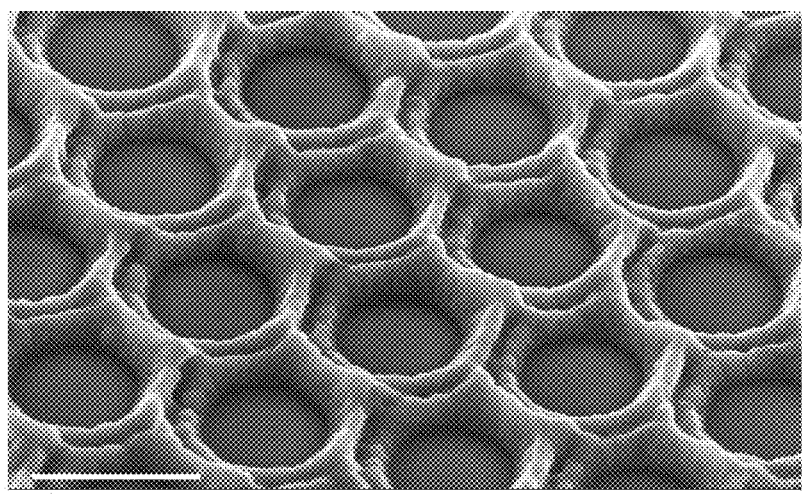
FIG. 6 represents a snapshot obtained by scanning electron microscopy in a step of the method for producing a textured reflector according to the invention.
Figure 7:
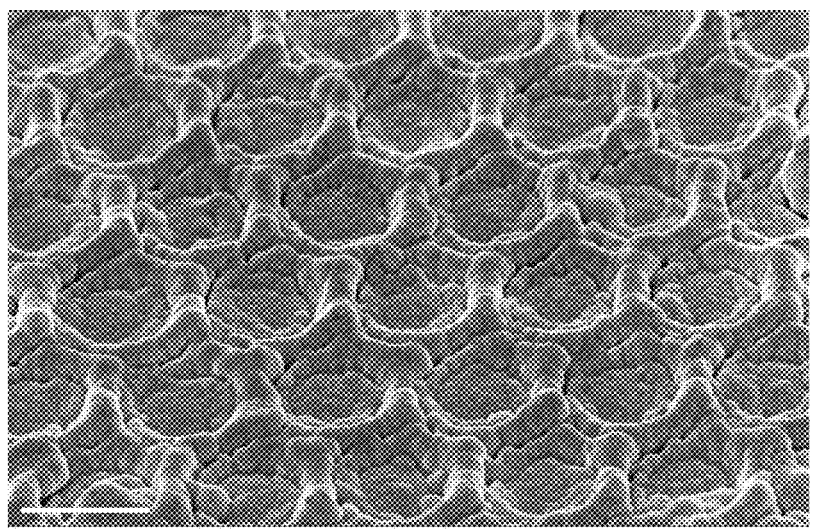
FIG. 7 represents a snapshot obtained by scanning electron microscopy on a solar cell according to the invention.

An aluminium film 1 with a thickness of 500 nm is then deposited by evaporation through the openings of each of the masks. After each of the masks 3 has been removed by ultrasounds, well-defined and regularly spaced metal dots 6 are obtained. For example purposes, FIG. 6 illustrates film 1 obtained with a mask 3 composed of balls 4 with a diameter of 1000 nm. Deposition of an additional silver film 8 with a thickness of 200 nm is then performed on each of the metal films previously produced by magnetron cathode sputtering. FIG. 7 represents the textured reflector obtained with mask 3 composed of balls 4 with a diameter of 1000 nm in order to obtain the textured reflector represented in FIG. 7.

Finally, each textured reflector is covered by the other components of the solar cell.

Calculation of the power absorbed by a wavelength range comprised between 600 nm and 1100 nm in each of the photovoltaic cells was then performed. The powers of the photovoltaic cells with a textured reflector, obtained from the different mean diameters of balls 4, were thus compared with the power of the same solar cell but with a non-textured reflector. The non-textured reflector is a flat silver layer, said silver layer being deposited by magnetron cathode sputtering and having a thickness of 300 nm.

Figure 8:
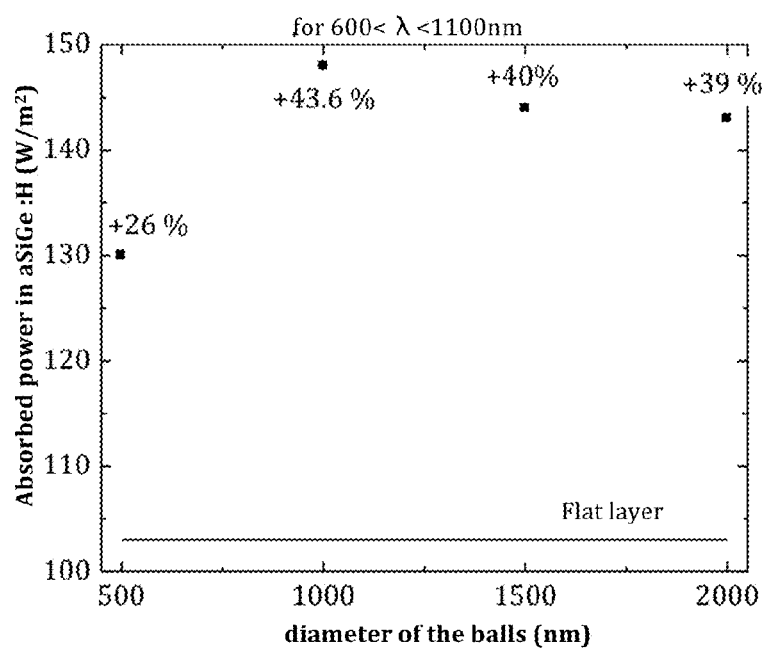
FIG. 8 represents the simulation of the power absorbed in a small gap solar cell (aSiGe) versus the diameter of the balls forming the mask for a solar cell comprising a textured reflector produced according to the invention, and for a solar cell with a non-textured reflector.

It was observed that the increase of the absorbed power calculated by optic simulation depends on the diameter of the balls. These different powers, dependent on the diameter of balls 4 of mask 3, are represented in FIG. 8.

It was observed that the increase of the power for a textured reflector as opposed to a non-textured reflector is maximal for a texture produced from balls 4 having a mean diameter of 1 μm: a gain of 43.6% is obtained.

Figure 9:
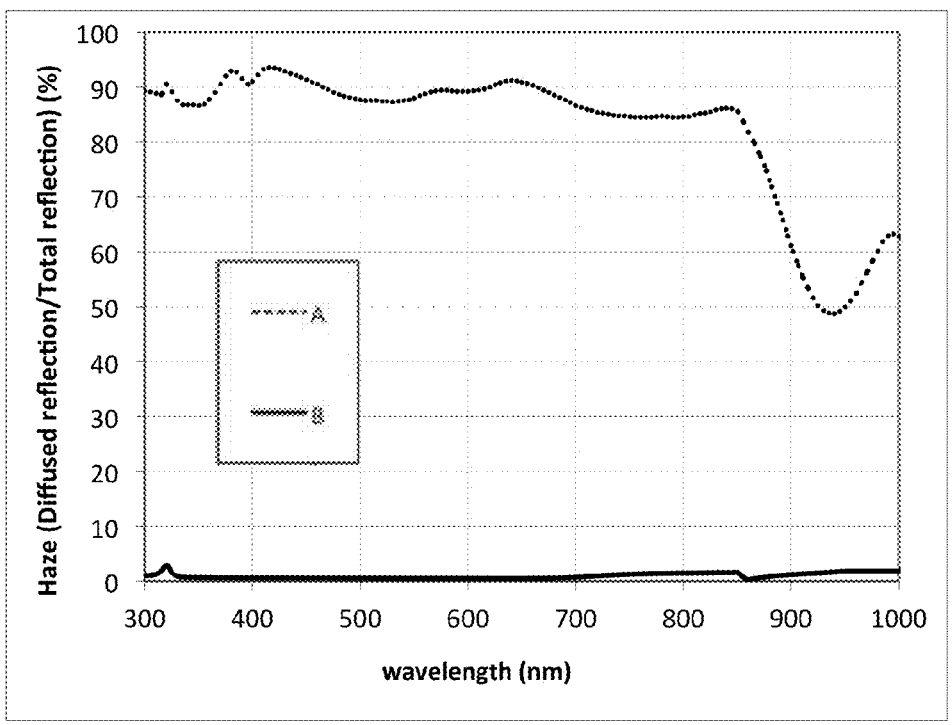
FIG. 9 represents the variation of the Haze factor versus the wavelength for a solar cell with a textured reflector according to the invention and for a solar cell with a non-textured reflector.

The Haze factor of a textured reflector was also measured. The Haze factor represents the ratio between the diffused reflection coefficient and the total reflection coefficient. The diffused reflection is particularly due to the texture of the reflector. Thus, in FIG. 9, the variation of the Haze factor is represented versus the wavelengths of the incident electromagnetic radiation for a textured reflector and for a non-textured reflector. The textured reflector presents improved optic properties. The Haze factor has in fact significantly increased for all the wavelengths, and more particularly it has increased by more than 80% for wavelengths comprised between 300 nm and 850 nm.

The presence of the textured reflector therefore generates an optic trapping, which will enable the conversion efficiency for the thin film solar cell deposited on such reflectors to be increased. The spectral response of the solar cells, representing the generation rate of electron-hole pairs in the cell will thus be improved.

Figure 10:
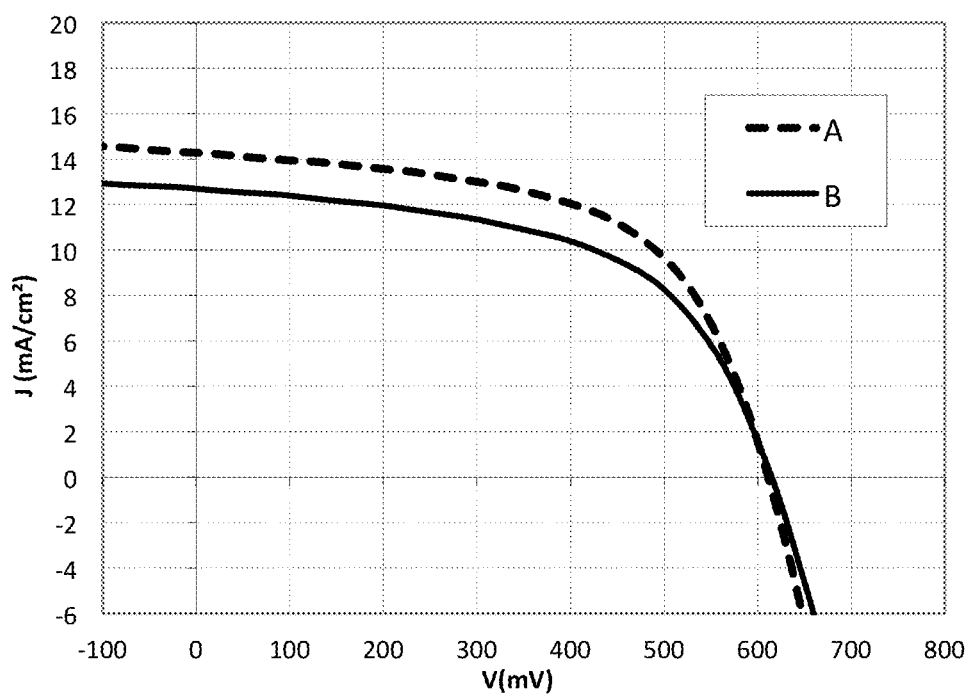
FIG. 10 represents the plot of the I(V) curve of the cell: the short-circuit current density versus the voltage of a solar cell with a textured reflector according to the invention and of a solar cell with a non-textured reflector.

The increase of the external quantum efficiency is translated into an increase of the short-circuit current density (Jsc). The short-circuit current for the solar cell having a textured reflector obtained from the mask having 1 μm balls (plot A in FIG. 10) was therefore compared with that of a solar cell without a textured reflector (plot B in FIG. 10). The short-circuit current density (Jsc) is represented versus the open circuit voltage (V). A gain of 10% is obtained for the solar cell with the textured reflector, corresponding to a gain of 15% in terms of efficiency.

Furthermore, determination of the characteristics Jsc, Voc, FF and EQE of 32 reference solar cells having a flat reflector and of 32 solar cells having the same reflector but textured was performed under a standardized lighting AM1.5, i.e. corresponding to a sun ray passing 1.5 times through the atmospheric mass, the sun being at the zenith. All the cells are aSiGe:H solar cells. The results are given in the table below. The reference solar cells are called "non-textured cells" and the solar cells having a textured reflector are called "textured cells". Jsc corresponds to the short-circuit current, Voc corresponds to the open circuit voltage, FF corresponds to the form factor of the solar cell and EQE stands for External Quantum Efficiency. The EQE corresponds to the ratio of the number of electronic charges collected over the number of incident photons. The results obtained are represented in the table below.

|  |  | Jsc (mA/cm$^2$) | Voc (mV) | FF (%) | EQE (%) | Number of functional cells |
|---|---|---|---|---|---|---|
| Non-textured cells | Maximum | 14.4 | 619 | 56 | 4.70 | 19/32 (59%) |
|  | Minimum | 12.3 | 592 | 51 | 3.77 |  |
|  | Mean | 12.8 | 615 | 54 | 4.28 |  |

-continued

|  |  | Jsc (mA/cm²) | Voc (mV) | FF (%) | EQE (%) | Number of functional cells |
|---|---|---|---|---|---|---|
| Textured cells | Maximum | 14.4 | 614 | 58 | 5.04 | 23/32 (72%) |
|  | Minimum | 13.8 | 609 | 54 | 4.62 |  |
|  | Mean | 14.1 | 612 | 57 | 4.90 |  |

The solar cells having a textured reflector therefore present improved performances compared with the solar cells having a flat reflector.

The scope of this invention in the field of solar cells is all the more extensive that it can be used for development of thin film solar cells such as cells of hydrogenated amorphous silicon a-Si:H type, cells of hydrogenated amorphous silicon-germanium a-SiGe:H type, cells made from hydrogenated monocrystalline silicon μc-Si:H, tandem cells, and multi-junction cells. The texturing method can in fact be adapted to any type of thin film solar cell, as it can be adjusted to the absorption range of the latter.

This type of textured reflector not only enables the efficiency of the cells to be improved by increasing the optic trapping, but also enables the thickness of the absorbent layer to be reduced while at the same time preserving the same cell efficiency. For certain solar cells, for example for a cell made from μc-Si:H, the thickness of the active layer being critical, a reduction of the thickness of the absorbent layer is an important issue.

The production method is moreover able to be applied to large surfaces and to any type of support.

The invention claimed is:

1. A method for producing a textured reflector for a thin film solar cell, comprising:
    depositing a first metal film on a support through openings of a mask, the mask being formed by a thin film formed by coplanar balls, the gaps between the balls forming the openings of the mask,
    removing the mask after deposition of the first metal film on the support, and
    conformally depositing an additional metal film on the first metal film after the mask has been removed,
    wherein
    a maximum thickness of the first metal film is comprised between 150 nm and 750 nm; and
    the maximum thickness of the first metal film corresponds to a height of peaks in the first metal film that are formed by the gaps in the balls forming the mask.

2. The method according to claim 1, wherein the balls forming the thin film are joined.

3. The method according to claim 1, wherein the balls are made from silica or from polymer material.

4. The method according to claim 1, wherein the film formed by the balls presents a compactness comprised between 80% and 94%.

5. The method according to claim 1, wherein the balls forming the thin film are monodispersed and their mean diameter is comprised between 100 nm and 5000 nm.

6. The method according to claim 5, wherein the mean diameter of the balls is comprised between 500 nm and 2500 nm.

7. The method according to claim 1, wherein deposition of the first metal film is performed by magnetron cathode sputtering or by vacuum evaporation.

8. The method according to claim 1, wherein the first metal film is formed by a metal selected from the group consisting of aluminum, chromium, silver, copper, and alloys thereof.

9. The method according to claim 1, wherein the mask is formed on the support by spin-coating or by the Langmuir-Blodgett method.

10. The method according to claim 1, wherein formation of the mask comprises etching the balls previously formed on the support in order to reduce their mean diameter.

11. The method according to claim 1, wherein the additional film is deposited by physical vapor deposition or by chemical vapor deposition.

12. The method according to claim 1, wherein the additional metal film has a thickness comprised between 50 nm and 1500 nm.

13. The method according to claim 12, wherein the additional metal film has a thickness comprised between 100 nm and 500 nm.

14. The method according to claim 1, wherein the additional metal film is formed by a metal selected from the group consisting of silver, aluminum, copper, chromium, titanium, and alloys thereof.

15. The method according to claim 1, wherein the first metal film and the additional metal film are respectively made from aluminum and from silver.

16. The method according to claim 1, wherein the support is made from metal.

17. A textured reflector for a thin film solar cell obtained by the method according to claim 1.

18. A method for producing a textured reflector for a thin film solar cell, comprising:
    depositing a first metal film on a support through openings of a mask, the mask being formed by a thin film formed by coplanar balls, the gaps between the balls forming the openings of the mask,
    removing the mask after deposition of the first metal film on the support, and
    conformally depositing an additional metal film on the first metal film after the mask has been removed,
    wherein formation of the mask comprises etching the balls previously formed on the support in order to reduce their mean diameter.

19. The method according to claim 18, wherein
    the balls formed on the support are in contact with each other before performing the etching to reduce their mean diameter; and
    the balls are etched to reduce their mean diameter before depositing the first metal film.

20. A method for producing a textured reflector for a thin film solar cell, comprising:
    depositing a first metal film on a support through openings of a mask, the mask being formed by a thin film formed by coplanar balls, the gaps between the balls forming the openings of the mask,
    removing the mask after deposition of the first metal film on the support, and
    conformally depositing an additional metal film on the first metal film after the mask has been removed,
    wherein
    deposition of the first metal film on the support through the openings of the mask forms a metal film having solid peaks, and
    the balls forming the mask are joined and/or the solid peaks are equidistant apart.

* * * * *